(12) United States Patent
VanVeghten et al.

(10) Patent No.: US 11,336,071 B2
(45) Date of Patent: May 17, 2022

(54) DEGRADATION DETECTION FOR A PULSED LASER

(71) Applicant: Lumentum Operations LLC, Milpitas, CA (US)

(72) Inventors: Tobyn VanVeghten, San Jose, CA (US); Joseph J. Alonis, Palo Alto, CA (US); James J. Morehead, Milpitas, CA (US); Loren A. Eyres, Palo Alto, CA (US)

(73) Assignee: Lumentum Operations LLC, San Jose, CA (US)

( * ) Notice: Subject to any disclaimer, the term of this patent is extended or adjusted under 35 U.S.C. 154(b) by 135 days.

(21) Appl. No.: 16/161,902

(22) Filed: Oct. 16, 2018

(65) Prior Publication Data

US 2019/0221991 A1   Jul. 18, 2019

Related U.S. Application Data

(60) Provisional application No. 62/618,331, filed on Jan. 17, 2018.

(51) Int. Cl.

| | | |
|---|---|---|
| *H01S 3/11* | (2006.01) | |
| *H01S 3/094* | (2006.01) | |
| *G01J 11/00* | (2006.01) | |
| *H01L 27/146* | (2006.01) | |
| *H01L 25/16* | (2006.01) | |
| *G01J 1/02* | (2006.01) | |
| *G01J 1/18* | (2006.01) | |
| *G01J 1/42* | (2006.01) | |

(52) U.S. Cl.
CPC .......... *H01S 3/1127* (2013.01); *G01J 1/0228* (2013.01); *G01J 1/18* (2013.01); *G01J 1/4257* (2013.01); *G01J 11/00* (2013.01); *H01L 25/167* (2013.01); *H01L 27/14643* (2013.01); *H01S 3/094076* (2013.01); *G01J 2001/4238* (2013.01)

(58) Field of Classification Search
CPC ............ H01S 3/1127; H01S 3/094076; H01S 5/0021; H01S 5/06832; H01S 5/0683; G01J 1/0228; G01J 1/18; G01J 1/4257; G01J 11/00; G01J 2001/4238; H01L 27/14643; H01L 25/167
See application file for complete search history.

(56) References Cited

U.S. PATENT DOCUMENTS

| | | | | |
|---|---|---|---|---|
| 6,549,267 | B1 * | 4/2003 | Kudo | G03B 27/42 355/53 |
| 2006/0076327 | A1 * | 4/2006 | Kobayashi | B23K 26/0613 219/121.73 |
| 2014/0109678 | A1 * | 4/2014 | Ichihara | H01S 3/092 73/655 |
| 2016/0204566 | A1 * | 7/2016 | Field | H01S 3/134 372/38.01 |

* cited by examiner

*Primary Examiner* — Xinning(Tom) Niu
(74) *Attorney, Agent, or Firm* — Harrity & Harrity, LLP

(57) ABSTRACT

A device may determine at least one metric related to a plurality of laser pulses associated with a Q-switched laser. The device may determine a statistical metric for the at least one metric related to the plurality of laser pulses. The device may determine that the statistical metric satisfies a threshold level of deviation of the at least one metric related to the plurality of laser pulses from a baseline value for the at least one metric. The device may indicate laser degradation of the Q-switched laser based on determining that the statistical metric satisfies the threshold.

17 Claims, 3 Drawing Sheets

DEGRADATION DETECTION FOR A PULSED LASER

RELATED APPLICATION(S)

This application claims priority under 35 U.S.C. § 119 to U.S. Provisional Patent Application No. 62/618,331, filed on Jan. 17, 2018, the content of which is incorporated by reference herein in its entirety.

TECHNICAL FIELD

The present disclosure relates to pulsed lasers. More particularly, some aspects of the present disclosure relate to degradation detection for a pulsed laser.

BACKGROUND

A pulsed laser, such as a Q-switched laser, may produce a pulsed output. This may enable the pulsed laser to produce a higher peak output and circulating power than may be possible using a continuous wave, which may improve frequency conversion in the pulsed laser and/or outside the pulsed laser and which may enable utilization in manufacturing applications, communication applications, and/or the like. Over time, the pulsed laser may experience degraded performance. For example, the pulsed laser may be associated with increasing amplitude instability over time. In this case, over time, the pulsed laser may begin to provide laser pulses with differing peak amplitudes. Similarly, over time, a build-up time for the pulsed laser to achieve a threshold output may increase, resulting in the pulsed laser failing to provide alternating laser pulses. In other words, rather than providing a set of laser pulses that the pulsed laser is configured to provide, the pulsed laser may provide every other pulse of the set of laser pulses, which may result in a halving of a pulsed laser repetition rate. For example, based on alternating laser pulses failing to be provided, a 200 kilohertz (kHz) laser may be reduced to operating as a 100 kHz laser. Laser degradation, such as from amplitude instability and/or from a reduction in a pulse frequency, may cause damage to manufacturing outputs, may interrupt communication, and/or the like.

SUMMARY

According to some possible implementations, a device may include one or more memories and one or more processors communicatively coupled to the one or more memories. The one or more processors may determine a set of build-up time metrics or pulse width metrics for a set of laser pulses of a pulsed laser. The one or more processors may determine based on the set of build-up time metrics or pulse width metrics, a condition for the pulsed laser. The one or more processors may indicate the condition for the pulsed laser.

According to some possible implementations, a method may include determining, by a device, at least one metric related to a plurality of laser pulses associated with a Q-switched laser. The method may include determining, by the device, a statistical metric for the at least one metric related to the plurality of laser pulses. The method may include determining, by the device, that the statistical metric satisfies a threshold level of deviation of the at least one metric related to the plurality of laser pulses from a baseline value for the at least one metric. The method may include indicating, by the device, laser degradation of the Q-switched laser based on determining that the statistical metric satisfies the threshold.

According to some possible implementations, a system may include at least one measurement device to measure a build-up time or a pulse width associated with a plurality of laser pulses. The system may include a controller to predict an error based on a deviation of the build-up time or the pulse width relative to a baseline value for the build-up time or the pulse width.

DETAILED DESCRIPTION

Figure 1A:
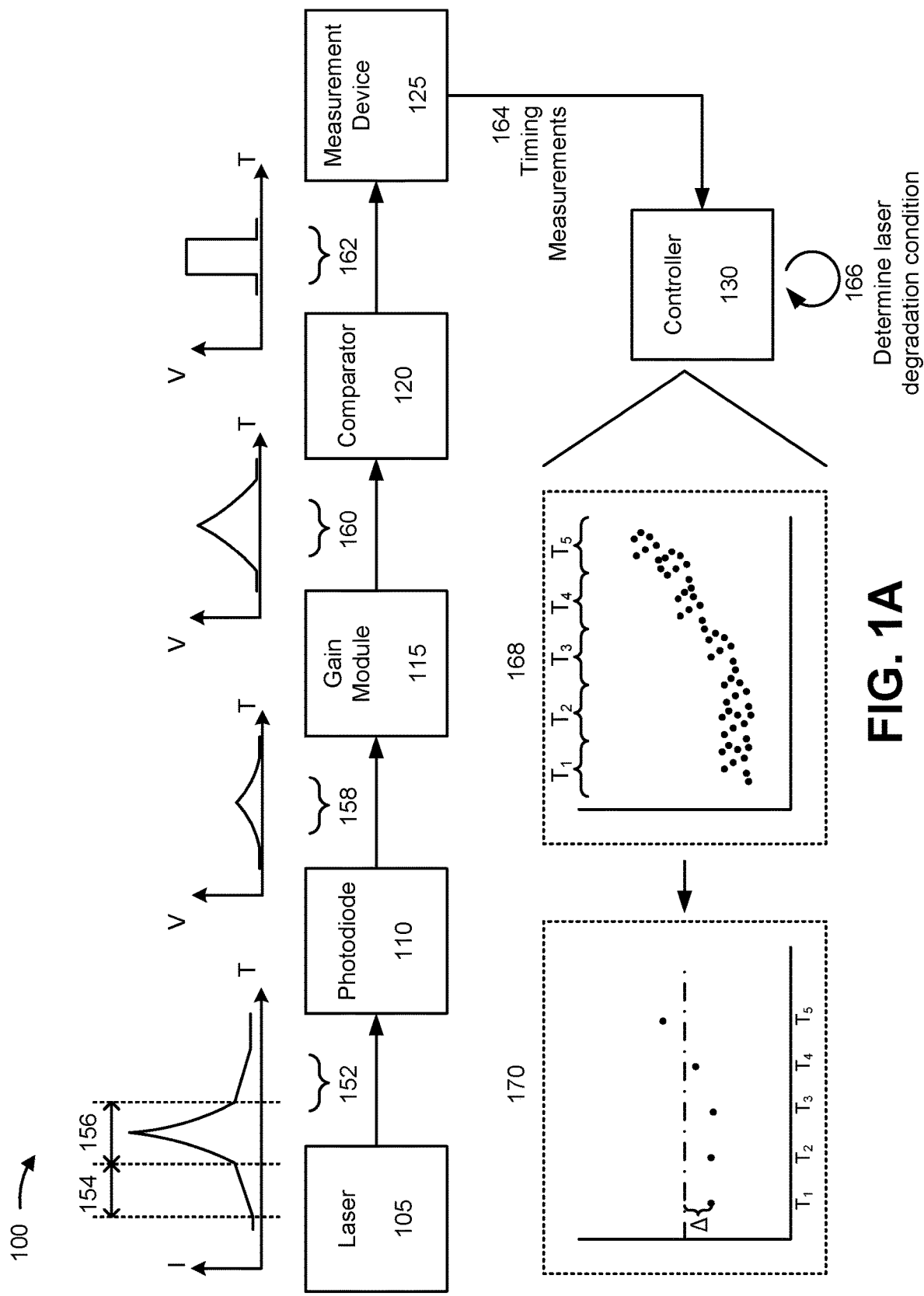
FIGS. 1A and 1B are diagrams of example implementations described herein.

The following detailed description of example implementations refers to the accompanying drawings. The same reference numbers in different drawings may identify the same or similar elements.

As described above, laser degradation may result in a negative impact to a system that includes a pulsed laser. For example, in a manufacturing procedure, a pulsed laser experiencing an amplitude instability condition may cause damage to a product of the manufacturing procedure. Similarly, in a communications system, a pulsed laser experiencing an amplitude instability condition may fail to communicate information, which may result in a communications interruption of the communications system. When a laser degradation condition is observed for a pulsed laser, it may be desirable to recalibrate the pulsed laser, repair the pulsed laser, or replace the pulsed laser to avoid damage to a product, interruption to communication, and/or the like. However, in increasingly complex systems, many components may cause negative impacts to a system when malfunctioning, which may cause difficulty in identifying a laser degradation condition. For example, a malfunctioning controller that is controlling a properly functioning pulsed laser may cause the properly functioning pulsed laser to damage a product, to fail to accurately communicate information, and/or the like. Similarly, other components in a system unrelated to a pulsed laser in the system may malfunction in a way that may be difficult to distinguish from malfunctioning of the pulsed laser in the system. Replacing a pulsed laser, when the pulsed laser is properly functioning, as a result of misidentifying a source of a negative impact to a system may result in excessive cost, excessive interruption to the system, and/or the like.

Some implementations, described herein, enable determination and/or prediction of laser degradation for a pulsed laser. For example, some implementations, described herein may measure a timing metric associated with laser pulses of the pulsed laser, may determine a statistical metric based on the timing metric (e.g., a mean metric, a median metric, a standard deviation metric, and/or the like relating to the timing metric), and may determine that the statistical metric satisfies a threshold. In this way, some implementations described herein may enable a proactive determination of a condition of a pulsed laser, such as whether the pulsed laser is experiencing or will experience a laser degradation condition (e.g., an amplitude instability condition, a reduction in laser pulse frequency, and/or the like). Further, based on identifying laser degradation for a pulsed laser, some implementations, described herein, may enable proactive correction of a system that includes the pulsed laser, such as by enabling proactive recalibration of the pulsed laser, proactive repair of the pulsed laser, or proactive replacement of the pulsed laser, proactive repair or replacement of another component in the system, and/or the like, thereby improving process control for the system, reducing a likelihood of damage caused to and/or by the system, and/or the like.

Figure 1B:
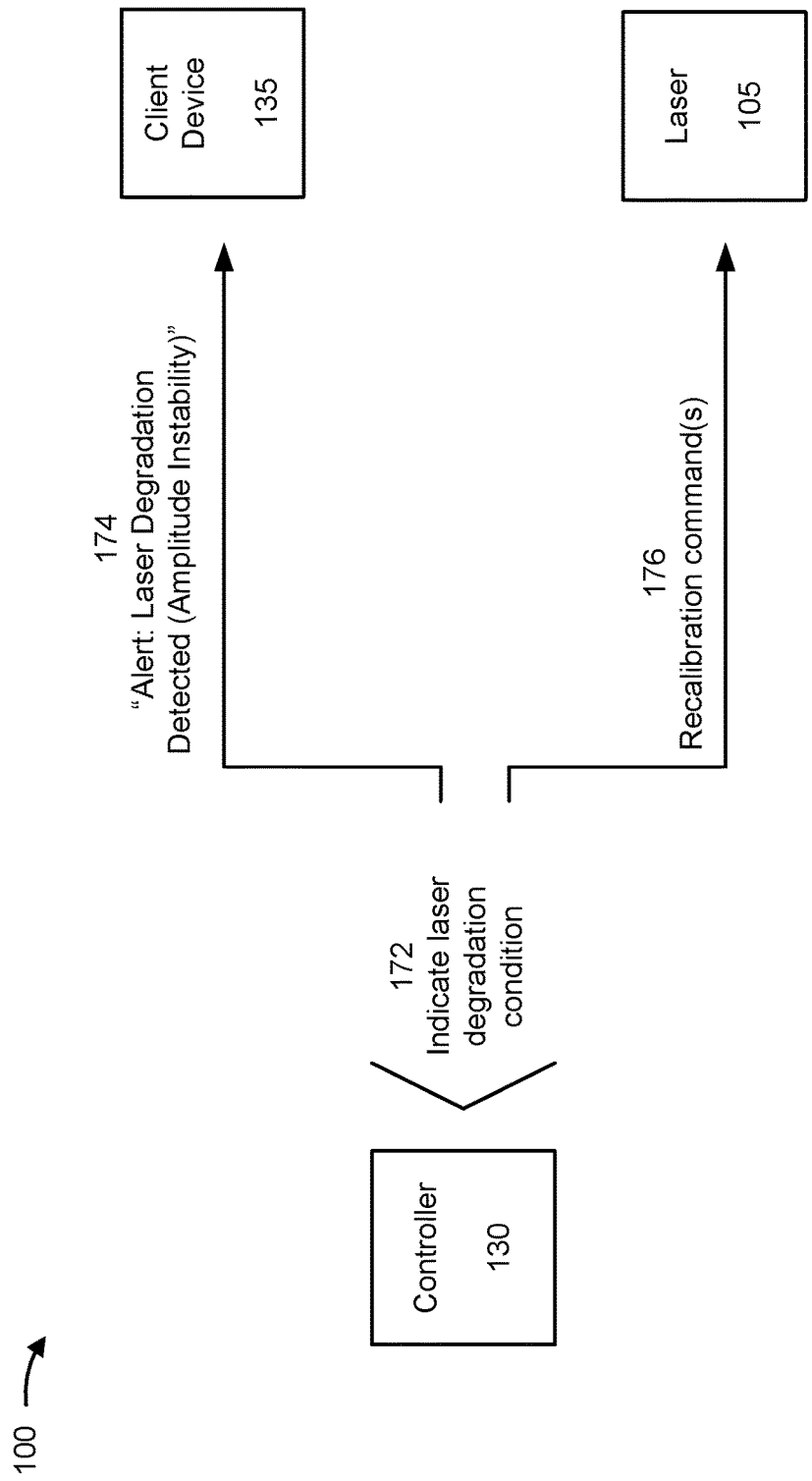

FIGS. 1A and 1B are diagrams of example implementations 100 of laser degradation detection for a pulsed laser. As shown in FIG. 1A, example implementation 100 includes a pulsed laser 105, a photodiode 110, a gain module 115, a comparator 120, a measurement device 125, and a controller 130.

As further shown in FIG. 1A, and by reference number 152, pulsed laser 105 may provide a set of laser pulses (a single laser pulse is shown as a function of intensity, I, over time, T), and photodiode 110 may detect the set of laser pulses. For example, pulsed laser 105 may be a pulsed laser, such as a Q-switched laser or another type of pulsed laser, that may provide a laser pulse based on receiving a signal to provide the laser pulse. In some implementations, a laser pulse may be associated with a set of characteristics. For example, as shown by reference number 154, a build-up time may be defined for a laser pulse as a time from the pulsed laser 105 releasing stored energy to cause the laser pulse to when the laser pulse satisfies a threshold intensity and is provided by pulsed laser 105. Similarly, as shown by reference number 156, a pulse width may be defined as a time from when the laser pulse satisfies the threshold intensity and is provided by pulsed laser 105 to when the laser pulse no longer satisfies the threshold intensity and is no longer provided by pulsed laser 105. In some implementations, the threshold intensity may be half of a peak intensity. In some implementations, pulsed laser 105 may provide a set of laser pulses associated with a particular pulse width, such as a pulse width of between 40 nanoseconds (ns) and 300 ns. In some implementations, such as based on degradation to pulsed laser 105, pulsed laser 105 may provide a set of laser pulses varying in amplitude (e.g., in peak intensity).

As further shown in FIG. 1A, and by reference number 158, based on photodiode 110 receiving the set of laser pulses, photodiode 110, in connection with a resistor, may provide a voltage output (e.g., the photodiode 110 may provide a current output) corresponding to the set of laser pulses (a voltage response is shown as a function of voltage, V, over time, T). For example, when photodiode 110, which may be a fast photodetector to detect a laser pulse with a pulse width between 40 ns and 300 ns, receives a laser pulse from pulsed laser 105, photodiode 110 may provide a response (e.g., a voltage pulse) that corresponds to an intensity of the laser pulse. In this case, for example, a threshold intensity of a laser pulse may correspond to a threshold voltage response, a peak intensity of the laser pulse may correspond to a peak voltage response, and/or the like. In some implementations, photodiode 110 may provide a response that is less than a threshold voltage. For example, photodiode 110 may provide a voltage that is less than a threshold for use with comparator 120, and may provide the voltage as an input to gain module 115 to cause gain module 115 to amplify the voltage. In some implementations, another example implementation may omit gain module 115.

As further shown in FIG. 1A, and by reference number 160, gain module 115 may apply a gain to the voltage to provide an amplified voltage to comparator 120. In this way, gain module 115 may cause the response provided by the photodiode to satisfy a threshold associated with comparator 120. In some implementations, gain module 115 may apply a fixed gain to provide the amplified voltage. In some implementations, gain module 115 may apply a variable gain. For example, for pulsed lasers 105 that may configured to provide laser pulses with amplitudes that differ by a threshold amount in different series, gain module 115 may provide a first gain for a first laser pulse amplitude and a second gain for a second laser pulse amplitude based on information identifying a configuration of pulsed laser 105 with respect to provide the first laser pulse amplitude and the second laser pulse amplitude.

As further shown in FIG. 1A, and by reference number 162, comparator 120 may receive the amplified voltage, and may convert the amplified voltage for output to measurement device 125. For example, when the amplified voltage is less than a voltage threshold, comparator 120 may provide a first fixed output (e.g., less than a threshold output) and when the amplified voltage is greater than or equal to the voltage threshold, comparator 120 may provide a second, higher fixed output (e.g., greater than or equal to the threshold output). In this case, the voltage threshold may be configured such that the first fixed output is provided during a build-up time period of a laser pulse, and such that the second fixed output is provided during a pulse width period of the laser pulse. In this way, comparator 120 enables a time-based measurement of the voltage response for high-speed laser pulses that may be associated with speeds too high for other types of measurements.

As further shown in FIG. 1A, and by reference number 164, measurement device 125, which may be a timer, may perform one or more timing measurements of the waveform, and may provide information identifying the one or more timing measurements to controller 130. For example, measurement device 125 may determine a timing measurement, such as by measuring a build-up time of a laser pulse. In this case, measurement device 125 may measure an amount of time the waveform is the first fixed output. Additionally, or alternatively, measurement device 125 may measure a pulse width of the laser pulse based on measuring an amount of time the waveform is the second fixed output. In some implementations, measurement device 125 may provide timing measurements associated with a particular subset of laser pulses. For example, measurement device 125 may provide first information identifying timing measurements for even indexed laser pulses and second information identifying timing measurements for odd indexed laser pulses, thereby enabling separate tracking of the even indexed laser pulses and the odd indexed laser pulses to enable measurement of pulsed lasers associated with greater than a threshold pulse frequency. Additionally, or alternatively, measurement device 125 may be a different type of measurement device, such as a voltage measurement device to perform a measurement of a voltage, and provide output identifying the measurement of the voltage.

As further shown in FIG. 1A, and by reference number 166, controller 130 may determine a laser degradation condition based on the timing measurements. For example, controller 130 may determine a set of statistical metrics regarding the timing metrics, and may predict laser degradation based on the set of statistical metrics. In some implementations, controller 130 may determine a laser degradation condition based on a statistical metric relating to a build-up time. For example, controller 130 may determine an average build-up time, a standard deviation for the build-up time, a minimum build-up time, a maximum build-up time, and/or the like for pulsed laser 105 based on timing metrics during a particular time period. Additionally, or alternatively, controller 130 may determine an average pulse width, a standard deviation for the pulse width, a minimum pulse width, a maximum pulse width, and/or the like.

As further shown in FIG. 1A, and by reference number 168, controller 130 may determine, for example, an average build-up time for a set of time periods $T_1$, $T_2$, $T_3$, $T_4$, and $T_5$. In this case, $T_1$ may represent a baseline condition for the average build-up time, and other time periods may be subsequent to $T_1$. As shown by reference number 170, controller 130 may determine whether the average build-up time satisfies a threshold. For example, controller 130 may determine that a metric during $T_5$ exceeds a threshold difference, $\Delta$, from the baseline condition of $T_1$. In this case, controller 130 may determine a degraded laser condition and/or may predict subsequent laser degradation based on the average build-up time satisfying the threshold.

In some implementations, controller 130 may determine, for example, the average build-up time on an ongoing basis. For example, controller 130 may determine the average build-up time based on a most recent threshold quantity of laser pulses, and may compare the average build-up time to a threshold to determine whether pulsed laser 105 is operating in a degraded condition. Similarly, controller 130 may determine a standard deviation for pulse widths in each time period, and may determine whether pulsed laser 105 is operating in a degraded condition based on whether the standard deviation for pulse widths in a particular time period satisfies a threshold representing a deviation from a baseline condition of the standard deviation for pulse widths.

In some implementations, controller 130 may determine the threshold based on a stored baseline condition. For example, controller 130 may store information identifying a set of operating parameter ranges for pulsed laser 105, and may determine that an observed operating parameter (e.g., an average build-up time) is not within the set of operating parameter ranges. Additionally, or alternatively, controller 130 may determine the threshold based on one or more timing measurements. For example, controller 130 may use a first one or more timing measurements, as shown, to identify a baseline condition of pulsed laser 105 (e.g., a normal operating parameter range for pulsed laser 105), and may determine that pulsed laser 105 is operating in a degraded condition when a second one or more timing measurements (e.g., performed on laser pulses occurring after laser pulses associated with the first one or more timing measurements) deviate from the baseline condition by a threshold amount (e.g., an observed average build-up time deviates from an earlier, baseline observed average build-up time).

In some implementations, controller 130 may determine the threshold based on a measured condition. For example, when controller 130 receives a first measurement identifying a first ambient temperature around pulsed laser 105, controller 130 may evaluate the statistical metric based on a first threshold relating to a first baseline for the first ambient temperature, and may use a second threshold relating to a second baseline for a second ambient temperature when a second measurement identifies the second ambient temperature around pulsed laser 105. Additionally, or alternatively, other factors may be used in determining which of a set of thresholds to select for evaluating the statistical metric.

As shown in FIG. 1B, and by reference number 172, controller 130 may indicate a laser degradation condition. For example, as shown by reference number 174, controller 130 may provide (e.g., to client device 135, such as for display) an alert indicating that pulsed laser 105 is operating in a degraded condition, such as based on determining that average build-up times or a standard deviation of build-up times satisfies a threshold. Additionally, or alternatively, controller 130 may provide an alert indicating that pulsed laser 105 is predicted to be operating in a degraded condition at a subsequent time, such as based on determining that average pulse widths or a standard deviation of pulse widths satisfies a threshold, based on determining that a slope of trendline for a set of average pulse widths satisfies a threshold slope, and/or the like. In some implementations, controller 130 may initiate an automatic solution to laser degradation. For example, as shown by reference number 176, controller 130 may provide one or more recalibration commands to pulsed laser 105 to recalibrate pulsed laser 105 to mitigate, for example, an amplitude instability condition. Additionally, or alternatively, controller 130 may automatically order a replacement part, change a manufacturing schedule to avoid using pulsed laser 105, and/or the like.

In this way, a condition of pulsed laser 105 may be determined using timing measurements rather than with other types of measurements, thereby reducing a difficulty in determining the condition of pulsed laser 105 relative to other techniques. Moreover, based on determining the condition of pulsed laser 105 (e.g., a current condition, a predicted condition, etc.), process control for processes using pulsed laser 105 may be improved.

As indicated above, FIGS. 1A and 1B are provided merely as examples. Other examples are possible and may differ from what was described with regard to FIGS. 1A and 1B.

Figure 2:
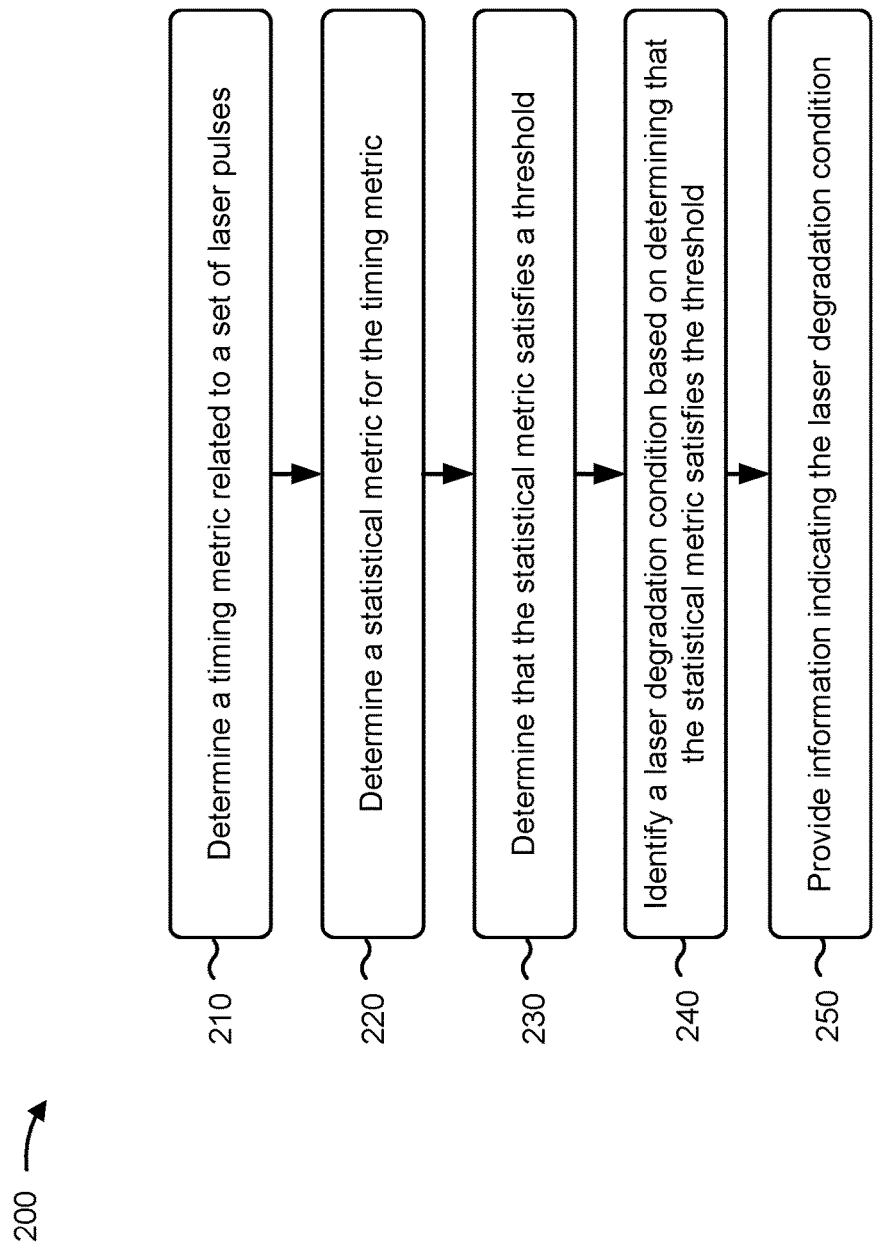
FIG. 2 is a flow chart of an example process for laser degradation detection for a pulsed laser, as described herein.

FIG. 2 is a flow chart of an example process 200 for laser degradation detection for a pulsed laser. In some implementations, process 200 may be performed by a device, such as a controller (e.g., controller 130), which may include one or more processors, one or more memories, and/or the like.

As shown in FIG. 2, process 200 may include determining a timing metric related to a set of laser pulses (block 210). For example, a device may determine the timing metric. In some implementations, the device may receive an indication of the timing metric. For example, the device may receive, from a measurement device, information identifying a build-up time for a laser pulse, a pulse width for a laser pulse, and/or the like. In some implementations, the device may store the information identifying the timing metric. For example, the device may store information identifying a group of build-up times for a group of consecutive laser pulses. Additionally, or alternatively, the device may store information identifying a group of build-up times for a group of non-consecutive laser pulses. For example, the device may store first information identifying build-up times for even-indexed laser pulses and may store second information identifying build-up times for odd-indexed laser pulses.

As shown in FIG. 2, process 200 may include determining a statistical metric for the timing metric (block 220). For example, the device may determine the statistical metric for the timing metric. In some implementations, the device may determine an average value metric. For example, the device may determine an average build-up time for a particular set of laser pulses, a first average build-up time for even-indexed laser pulses and a second average build-up time for odd-indexed lasers pulses, and/or the like. Additionally, or alternatively, the device may determine another statistical metric, such as a standard deviation metric, a minimum value metric, a maximum value metric, a median value metric, and/or the like.

In some implementations, the device may store the statistical metric. For example, the device may determine the statistical metric, and may store the statistical metric as a baseline value. In this case, the device may use the baseline value for determining a subsequent deviation from the baseline value, which may indicate degradation to pulsed laser performance. For example, the device may determine that a subsequent statistical metric differs from the baseline value by a threshold amount, and may determine that a pulsed laser is operating in a degraded condition based on determining that the statistical metric differs from the baseline value by the threshold amount. Additionally, or alternatively, the device may store the statistical metric to determine a trend based on a set of statistical metrics, which may indicate a trend for predicting subsequent degradation to pulsed laser performance.

As shown in FIG. 2, process 200 may include determining that the statistical metric satisfies a threshold (block 230). For example, the device may determine that the statistical metric satisfies the threshold. In some implementations, the device may determine that the statistical metric satisfies the threshold based on comparing the statistical metric to another statistical metric. For example, the device may determine that an observed average build-up time deviates from the baseline value by a threshold amount indicating that the pulsed laser is operating in a degraded condition. In this case, the baseline value may be selected based on a first statistical metric regarding a first set of timing metrics determined based on a first set of laser pulses, and the observed average build-up time may be determined based on a second set of timing metrics determined based on a second set of laser pulses subsequent to the first set of laser pulses. In this way, the device may use stored information regarding a first state of a pulsed laser to identify, at a subsequent time, a second state of the pulsed laser (e.g., a degraded condition of the pulsed laser).

As an example, the device may determine a difference in an average build-up time between a baseline time period and a subsequent observed time period, a difference in a standard deviation of a build-up time between a baseline time period and a subsequent observed time period, and/or the like. In this case, based on the difference satisfying a configured threshold, the device may determine a present condition of the pulsed laser (e.g., that the pulsed laser is operating in a degraded condition). Additionally, or alternatively, the device may determine a predicted future condition of the pulsed laser (e.g., that the pulsed laser will be subsequently operating in a degraded condition). In this case, the device may predict, based on a trend identified based on the statistical metric, that the pulsed laser is currently operating in an acceptable condition, but will be operating in a degraded condition at a subsequent time. In this case, the device may predict the degraded condition while the device is still operating in the acceptable condition, thereby avoiding damage to a system that includes the pulsed laser. As yet another example, the device may determine that a standard deviation for pulse widths for a set of laser pulses exceeds a standard deviation threshold, indicating that the pulsed laser is operating in a degraded condition.

In some implementations, the device may determine that the statistical metric satisfies the threshold based on a trend. For example, based on a set of statistical metrics, the device may determine that an average build-up time is increasing, and is predicted to exceed a threshold average build-up time within a threshold period of operation time. In this case, the device may predict a degraded condition is to occur after the threshold period of operation time, and may perform a response action, as described in more detail below, proactively before the degraded condition occurs. In this way, the device may avoid damage to a product manufactured using a system that includes the pulsed laser, avoid damage to the system, avoid interruption to system operation, and/or the like.

In some implementations, the device may determine that a subset of values of the statistical metric satisfy the threshold. For example, the device may track values relating to even laser pulses separately from values relating to odd laser pulses, and may determine that the statistical metric satisfies the threshold based on the values relating to the even laser pulses or the values relating to the odd laser pulses satisfying the threshold. Additionally, or alternatively, the device may determine that values relating to a particular time period satisfy the threshold. For example, the device may determine that a statistical metric regarding a last n quantity of values of a timing metric relating to a last n quantity of laser pulses satisfies the threshold. As another example, the device may determine that a statistical metric regarding a set of laser pulses during a threshold time period of length t satisfies the threshold.

As shown in FIG. 2, process 200 may include identifying a laser degradation condition based on determining that the statistical metric satisfies the threshold (block 240). For example, the device may determine that the pulsed laser is operating in a degraded condition based on determining that the statistical metric satisfies the threshold. In some implementations, the device may determine that the pulsed laser will be operating in a degraded condition at a subsequent time. For example, a threshold value for the statistical metric may be associated with a prediction of future degradation to a condition of a pulsed laser, and the device may predict subsequent degradation based on determining that the statistical metric satisfies the threshold. In some implementations, the device may use a machine learning model trained based on data relating to the pulsed laser and/or one or more other pulsed lasers to predict future degradation based on the statistical metric, an extrapolation (e.g., a linear, exponential, logarithmic, etc. extrapolation), and/or the like. In this case, the device may configure the threshold based on the machine learning model. In some implementations, the device may determine that the pulsed laser is operating in the degraded condition based on a threshold quantity of statistical metrics satisfying the threshold. For example, the device may determine that statistical metrics for a threshold quantity of time periods satisfy the threshold, and may determine that the laser is operating in a degraded condition rather than experiencing a temporary deviation in operation.

As shown in FIG. 2, process 200 may include providing information indicating the laser degradation condition (block 250). For example, the device may provide an indication that the pulsed laser is operating in a degraded condition and/or is predicted to operate in a degraded condition. In this way, the device may enable an operator to identify a cause of a malfunction to a system including the pulsed laser, to avoid a malfunction to the system including the pulsed laser, and/or the like. In some implementations, the device may provide the information for display, such as by using an output component to display an indicator of the laser degradation condition. In some implementations, the device may transmit an alert to another device. For example, the device may transmit a message indicating the laser degradation condition to enable the other device to provide information for display, to perform a response action, and/or the like. In some implementations, the device may automatically cause a response action to be performed. For example, the device may determine a calibration signal, and may provide the calibration signal to cause the pulsed laser to be recalibrated. Additionally, or alternatively, the device may transmit a control signal to a machine to cause the pulsed laser to be automatically repaired or replaced. Additionally, or alternatively, the device may transmit a control signal to a system to cause the pulsed laser to be omitted from use (e.g., to cause manufacturing to occur using other pulsed lasers of the system until the pulsed laser experiencing the laser degradation condition is replaced or recalibrated). Additionally, or alternatively, the device may transmit a message to automatically order a replacement pulsed laser.

Although FIG. 2 shows example blocks of process 200, in some implementations, process 200 may include additional blocks, fewer blocks, different blocks, or differently arranged blocks than those depicted in FIG. 2. Additionally, or alternatively, two or more of the blocks of process 200 may be performed in parallel.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
one or more memories; and
one or more processors, communicatively coupled to the one or more memories, to:
determine a set of build-up time metrics for a set of laser pulses of a Q-switched laser,
wherein the build-up time metrics correspond to a build-up time that is defined, for a corresponding laser pulse, as a time from the Q-switched laser releasing stored energy to cause the corresponding laser pulse to when the corresponding laser pulse satisfies a threshold intensity;
determine, based on the set of build-up time metrics, a condition for the Q-switched laser,
wherein the one or more processors, when determining the condition, are to:
compare a first subset of the set of build-up time metrics associated with even laser pulses of the set of laser pulses to a second subset of the set of build-up time metrics associated with odd laser pulses of the set of laser pulses;
determine, based on comparing the first subset to the second subset, that a threshold is satisfied between the first subset and the second subset; and
determine the condition based on determining that the threshold is satisfied; and
indicate the condition for the Q-switched laser.

2. The device of claim 1, wherein the condition is a present condition or a predicted future condition.

3. The device of claim 1, wherein the one or more processors, when determining the condition, are to:
determine a standard deviation for values of the set of build-up time metrics;
determine that the standard deviation satisfies a threshold; and
determine the condition based on determining that the standard deviation satisfies the threshold.

4. The device of claim 1, wherein the one or more processors, when determining the condition, are to:
compare the set of build-up time metrics to a baseline value associated with another set of laser pulses occurring before the set of laser pulses.

5. A method, comprising:
determining, by a device, at least one metric related to a plurality of laser pulses associated with a Q-switched laser, the at least one metric including:
a build-up time metric,
wherein the build-up time metric corresponds to a build-up time that is defined, for a corresponding laser pulse, as a time from the Q-switched laser releasing stored energy to cause the corresponding laser pulse to when the corresponding laser pulse satisfies a threshold intensity;
dividing, by the device, the plurality of laser pulses into a first subset of pulses and a second subset of pulses, wherein the first subset of pulses are even laser pulses and the second subset of pulses are odd laser pulses;
determining, by the device, a statistical metric for the build-up time metric related to the plurality of laser pulses,
wherein determining the statistical metric comprises:
determining the statistical metric for the first subset of pulses and for the second subset of pulses;
determining, by the device, that the statistical metric satisfies a threshold level of deviation of the build-up time metric related to the plurality of laser pulses from a baseline value for the build-up time metric; and
indicating, by the device, laser degradation of the Q-switched laser based on determining that the statistical metric satisfies the threshold level of deviation.

6. The method of claim 5, wherein the statistical metric is at least one of:
a minimum value,
a maximum value,
a standard deviation,
an average value, or
a median value.

7. The method of claim 5, further comprising:
storing information identifying the baseline value for the build-up time metric; and
wherein determining that the statistical metric satisfies the threshold level of deviation comprises:
comparing the statistical metric to the stored information identifying the baseline value.

8. The method of claim 5, wherein the threshold level of deviation relates to a difference between the first subset of pulses and the second subset of pulses.

9. The method of claim 5, further comprising:
recalibrating the Q-switched laser based on determining that the statistical metric satisfies the threshold level of deviation.

10. A system, comprising:
at least one measurement device to measure a build-up time associated with a plurality of laser pulses of a Q-switched laser,
wherein the build-up time is defined for a corresponding laser pulse as a time from the Q-switched laser releasing stored energy to cause the corresponding laser pulse to when the corresponding laser pulse satisfies a threshold intensity;
a controller to divide the plurality of laser pulses into a first subset of pulses and a second subset of pulses,
wherein the first subset of pulses are even laser pulses and the second subset of pulses are odd laser pulses;
the controller to determine, for the first subset of pulses and for the second subset of pulses, a statistical metric for the build-up time; and
the controller to predict an error associated with the Q-switched laser based on the statistical metric indicating a threshold deviation of the build-up time relative to a baseline value for the build-up time.

11. The system of claim 10, further comprising:
the Q-switched laser.

12. The system of claim 10, further comprising:
a photodiode to receive the plurality of laser pulses and provide a voltage output corresponding to the plurality of laser pulses,
wherein the measurement device is to measure the build-up time based on the voltage output.

13. The system of claim 10, further comprising:
a gain module to receive a voltage output corresponding to the plurality of laser pulses and amplify the voltage output to enable the measurement device to measure the voltage output to measure the build-up time,
wherein the gain module is to apply a fixed gain or a variable gain.

14. The system of claim 10, further comprising:
a comparator to receive a voltage output corresponding to the plurality of laser pulses and provide a waveform corresponding to the voltage output to enable the measurement device to measure the voltage output to measure the build-up time.

15. The system of claim 10, wherein the measurement device comprises at least one of:
a voltage measurement device, or
a timer.

16. The system of claim 10, wherein the controller is to predict the error with receiving information identifying a measurement of a pulse amplitude of the plurality of laser pulses.

17. The device of claim 1, wherein the one or more processors, when determining the condition for the Q-switched laser, are to:
determine the condition based on the set of build-up time metrics satisfying a metric threshold for a threshold period of time.

* * * * *